(12) United States Patent
Westberg et al.

(10) Patent No.: US 8,018,727 B2
(45) Date of Patent: Sep. 13, 2011

(54) GAUGE CIRCUIT BOARD HOLDING DEVICE

(75) Inventors: Todd Westberg, Cherry Valley, IL (US); James Verdouw, Spring Valley, WI (US)

(73) Assignee: Auto Meter Products, Inc., Sycamore, IL (US)

( * ) Notice: Subject to any disclaimer, the term of this patent is extended or adjusted under 35 U.S.C. 154(b) by 932 days.

(21) Appl. No.: 11/925,528

(22) Filed: Oct. 26, 2007

(65) Prior Publication Data

US 2008/0101043 A1     May 1, 2008

Related U.S. Application Data

(60) Provisional application No. 60/855,000, filed on Oct. 27, 2006.

(51) Int. Cl.
*H05K 7/12* (2006.01)

(52) U.S. Cl. ........ 361/742; 361/758; 361/770; 361/804; 174/138 G; 174/138 E

(58) Field of Classification Search ................. 361/742, 361/758, 770, 804; 174/138 G, 138 E
See application file for complete search history.

(56) References Cited

U.S. PATENT DOCUMENTS

| | | | | |
|---|---|---|---|---|
| 5,414,593 | A * | 5/1995 | Furlan | 361/784 |
| 6,528,986 | B2 * | 3/2003 | Ballard | 324/142 |
| 6,754,067 | B2 * | 6/2004 | Turner et al. | 361/659 |
| 6,892,646 | B1 * | 5/2005 | Zimmerman et al. | 102/293 |
| 7,215,557 | B2 * | 5/2007 | Glovatsky et al. | 361/804 |

* cited by examiner

*Primary Examiner* — Dameon Levi
(74) *Attorney, Agent, or Firm* — Nixon Peabody LLP

(57) ABSTRACT

A meter spacer unit includes a dial spacer, a lateral spacer flexibly connected to the dial spacer by a joint, and a rear connecting member flexibly connected to the lateral spacer by a joint. The lateral spacer includes a connection member adapted to connect to a printed circuit board.

24 Claims, 10 Drawing Sheets

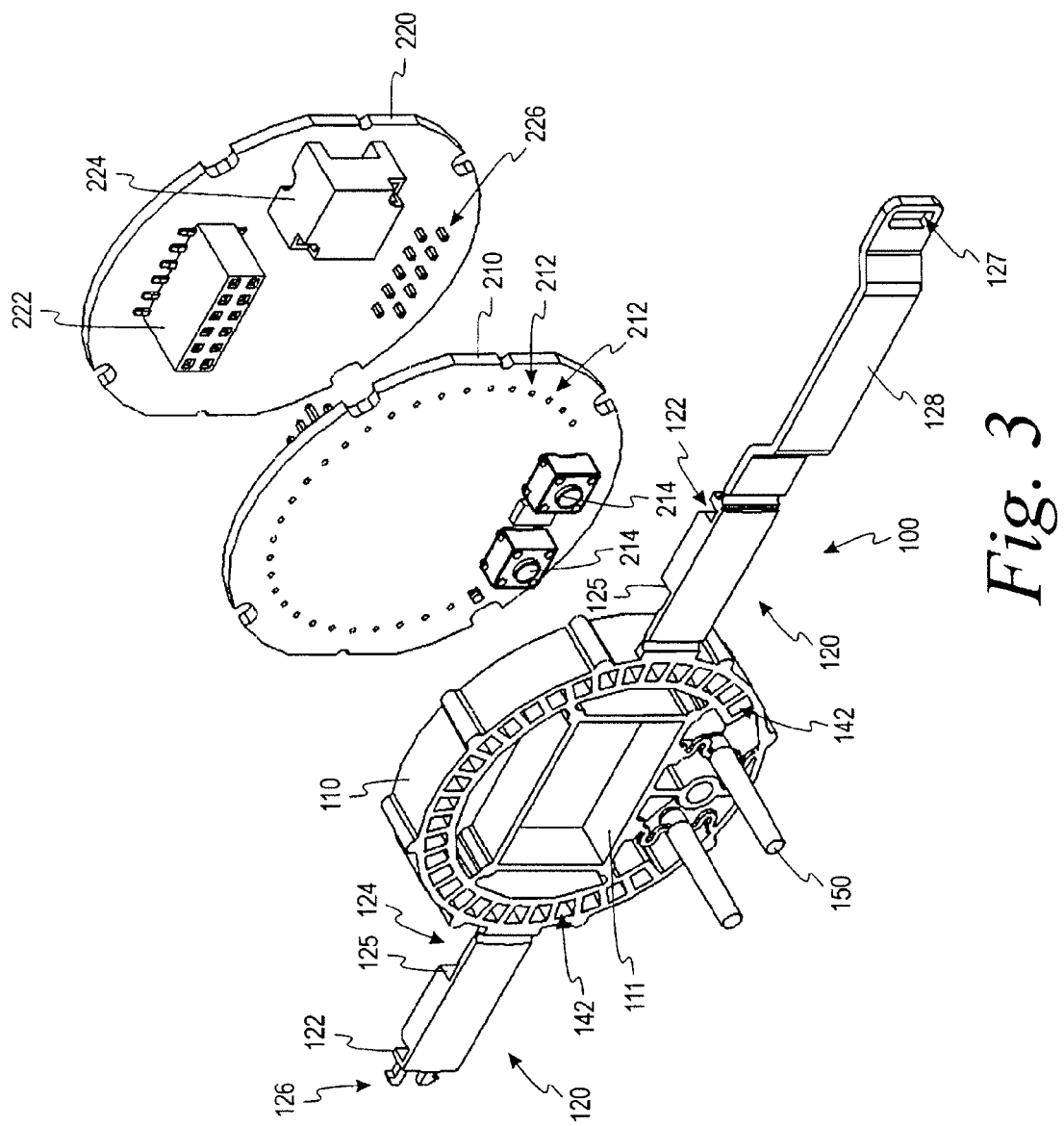

GAUGE CIRCUIT BOARD HOLDING DEVICE

CROSS-REFERENCE TO RELATED APPLICATIONS

This application is a U.S. Non-Provisional Application, which claims the benefit of priority of U.S. Provisional Patent Application No. 60/855,000, filed Oct. 27, 2006, which is incorporated herein by reference in its entirety.

FIELD OF THE INVENTION

The present invention relates generally to spacers and fasteners for printed circuit boards and, more particularly, to spacers and fasteners for printed circuit boards incorporated into sensing devices such as, but not limited to, the gauges or meters used in automotive or vehicular applications for speedometers, tachometers and the like.

BACKGROUND OF THE INVENTION

FIGS. 1(a)-(b) show a conventional arrangement of spacers 30, 40 for printed circuit boards incorporated into a meter, such as those used in automotive or vehicular applications for speedometers, tachometers and the like. The components shown in FIGS. 1(a)-(b) comprise three printed circuit boards (PCBs) 20, two opposing spacers 30 bearing grooves 32, a dial spacer 40, and three pushbutton shafts 50.

The uppermost PCB 20, which is disposed adjacent the dial spacer 40, is shown to include a display element (e.g., an LED display) 22, a plurality of shaft contacts or switching elements 24 corresponding in number to the number of pushbutton shafts 50, and a plurality of LEDs 26 disposed about a circumferential portion of the PCB. The LEDs 26 form, in at least some aspects, an arcuate bar graph indicator in which specific LEDs are selectively illuminated in correspondence with an increased magnitude of a measured quantity. One example of this type of indicator is provided in the wide band air/fuel ratio meter manufactured by Auto Meter Products, Inc., of Sycamore, Ill. This meter receives an input signal from a sensor measuring the exhaust gas and, corresponding to an output voltage of the sensor, the sensors are selectively illuminated. For example, a first grouping of LEDs 26 may be selectively illuminated from a specified center point or starting point to indicate a range of acceptable air/fuel ratios, a second grouping of LEDs may be selectively illuminated from a specified center point or starting point to indicate a range of lean air/fuel ratios, and a third grouping of LEDs may be selectively illuminated from a specified center point or starting point to indicate a range of rich air/fuel ratios. Likewise, the display element 22 is configured to display information in a numeric or alphanumeric format to provide information corresponding in type to the gauge. For example, the display element 22 provides information corresponding to the gauge type such as, but not limited to, a peak horsepower, a speed, an acceleration time, a braking distance, G Forces (GS).

Each of the spacers 30 shown in FIGS. 1(a)-(b) comprises three grooves 32, each of the grooves being dimensioned to receive and retain an edge portion of a respective one of the PCBs 20. During manufacture, the spacers 30 are fastened to edges of the PCBs 20, using the grooves 32, in opposition to one another across the PCBs. Following assembly on the PCBs 20, the dial spacer 40 is disposed over the uppermost PCB 20 to space apart the uppermost or outermost PCB 20 from the dial face or window (not shown) of the meter or gauge, as well as to visually segment the light and/or other information output from or printed upon (e.g., numerals) the uppermost PCB. The dial spacer 40 comprises openings 41 for pushbutton shafts 50 or shaft extensions, which are disposed to extend substantially from shaft switching elements 24, through the openings 41 and the dial face or window, and to a position accessible by a user of the meter or gauge.

FIG. 1(b) shows an assembled view of the gauge assembly comprising the above-noted spacers 30 and the dial spacer 40. The pushbutton shafts 50 are inserted into corresponding openings 41 (see FIG. 1(a)) defined within the dial spacer 40 in a location corresponding to the locations of the shaft switching elements 24 on the uppermost PCB 20. The display element 22 is similarly shown in FIG. 1(a) to reside within an opening 44 defined by side walls within the dial spacer 40. The dial spacer 40 further defines a plurality of openings 42 corresponding to the locations of the plurality of LEDs 26 disposed about a circumferential portion of the uppermost PCB 20, shown in FIG. 1(a), to permit transmission of light therethrough.

SUMMARY OF THE INVENTION

In one aspect of at least some embodiments in accord with the present concepts, a meter spacer unit includes a dial spacer, a lateral spacer flexibly connected to the dial spacer by a first joint, and a rear connecting member flexibly connected to the lateral spacer by a second joint. The lateral spacer includes a connection member adapted to connect to a printed circuit board.

In another aspect of at least some embodiments in accord with the present concepts, a meter dial spacer unit includes an injected molded body, the body defining a pushbutton opening and one or more resilient links spanning the pushbutton opening, the one or more resilient links having a pushbutton shaft extending therefrom.

In yet another aspect of at least some embodiments in accord with the present concepts, a meter includes a unitary meter spacer device defining a dial spacer, at least one lateral spacer flexibly connected to the dial spacer by a first joint and positioned to extend outwardly beneath the dial spacer, and a rear connecting member flexibly connected by a second joint to the at least one lateral spacer. The lateral spacer includes a connection member adapted to connect to a circuit board and the dial spacer includes a display device opening. The meter also includes a first circuit board which includes a display device. The first circuit board is disposed behind the dial spacer and is connected to the lateral spacer connection member with the display device being positioned to at least substantially occupy the dial spacer display device opening. The meter also includes a housing defining a cavity and a dial face connected to the housing. The unitary meter spacer device and the attached first circuit board are disposed within the housing cavity with the display device disposed adjacent the dial face.

In another aspect of at least some embodiments in accord with the present concepts, a method of making a meter subassembly includes the act of providing a unitary meter spacer device defining a dial spacer, a first lateral spacer flexibly connected by a first joint to the dial spacer, a second lateral spacer flexibly connected by a third joint to a portion of the dial spacer opposite to the first lateral spacer, and a rear connecting member flexibly connected by a second joint at a first end to the second lateral spacer. The first lateral spacer and the second lateral spacer each include a connection member adapted to connect to a circuit board. The method of making a meter subassembly also includes rotating the first lateral spacer and the second lateral spacer about the first joint and third joint, respectively, connecting the respective first lateral spacer and the second lateral spacer to the dial spacer to extend outwardly and substantially downwardly relative to the dial spacer. The method of making a meter subassembly also includes the acts of providing a first circuit board, connecting the first circuit board to the connection member of the first lateral spacer, and connecting the first circuit board to the connection member of the second lateral spacer.

In still another aspect of at least some embodiments in accord with the present concepts, a method of making a meter includes the act of forming a meter subassembly, the acts being described above. The method of making a meter further includes the acts of providing a meter housing defining a cavity, inserting the meter subassembly into the housing, placing a dial face over the dial spacer, and connecting the dial face to the housing.

A method of making a meter includes the acts of forming a meter subassembly by securing a plurality of circuit boards to a unitary meter spacer device, the unitary meter spacer device comprising a dial spacer and a plurality of lateral spacers depending therefrom, each of the lateral spacers comprising a plurality of spaced apart circuit board connection members to retain a plurality of circuit boards in a spaced apart configuration. The method of making a meter further includes the acts of providing a meter housing defining a cavity, inserting the meter subassembly into the housing, placing a dial face over the dial spacer, and connected the dial face to the housing.

BRIEF DESCRIPTION OF THE DRAWINGS

The foregoing and other advantages of the invention will become apparent upon reading the following detailed description and upon reference to the drawings in which:

FIG. 3 is an isometric and exploded view of a spacer unit relative to two printed circuit boards in accord with at least some aspects of the present concepts.

Figure 1A:
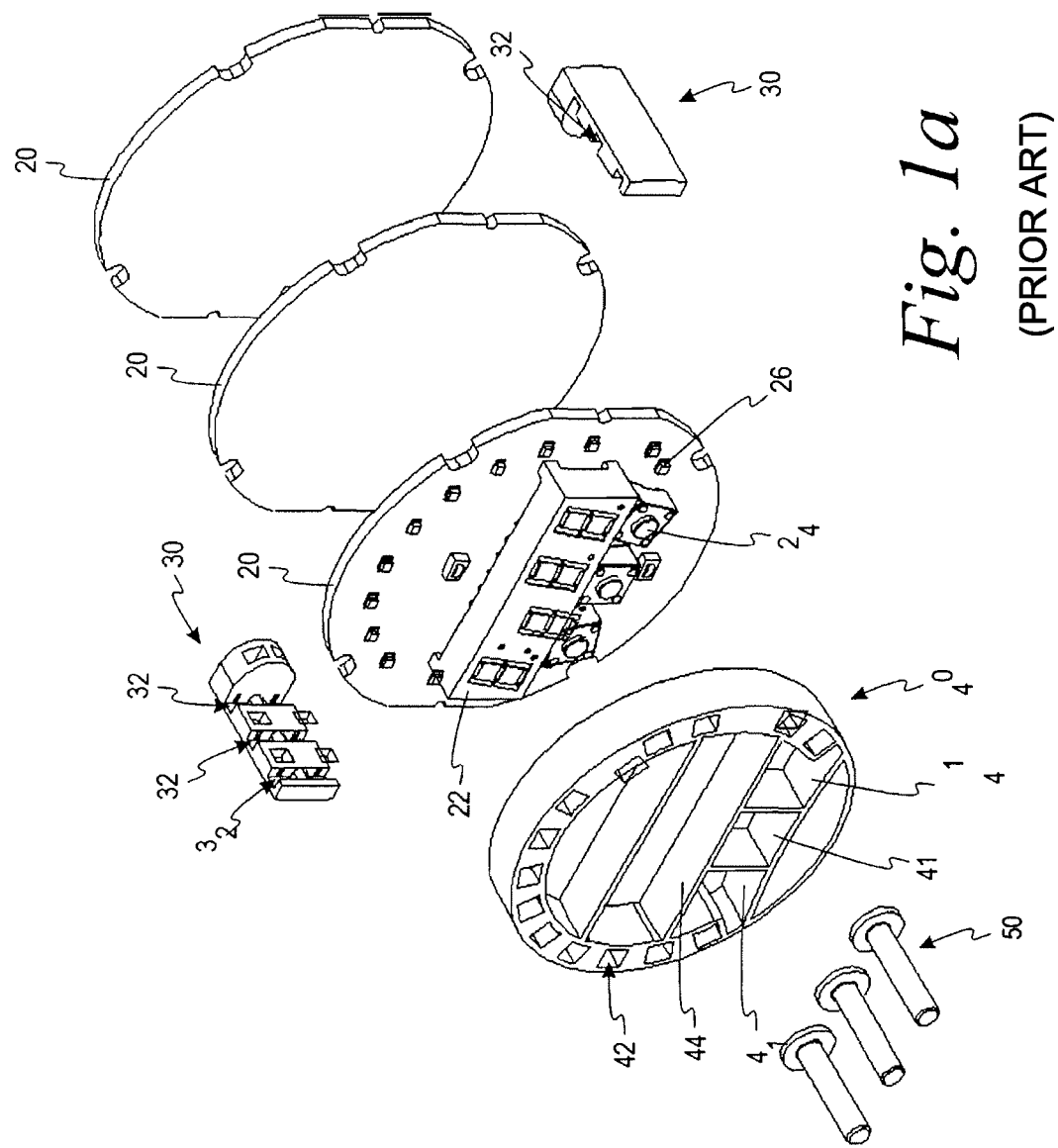
FIGS. 1(a)-(b) are, respectively, an exploded isometric view of a gauge assembly comprising conventional gauge spacer components and an assembled view of a gauge assembly comprising conventional gauge spacer components.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents, and alternatives falling within the spirit and scope of the invention as defined by the appended claims.

DETAILED DESCRIPTION

Figure 2A:
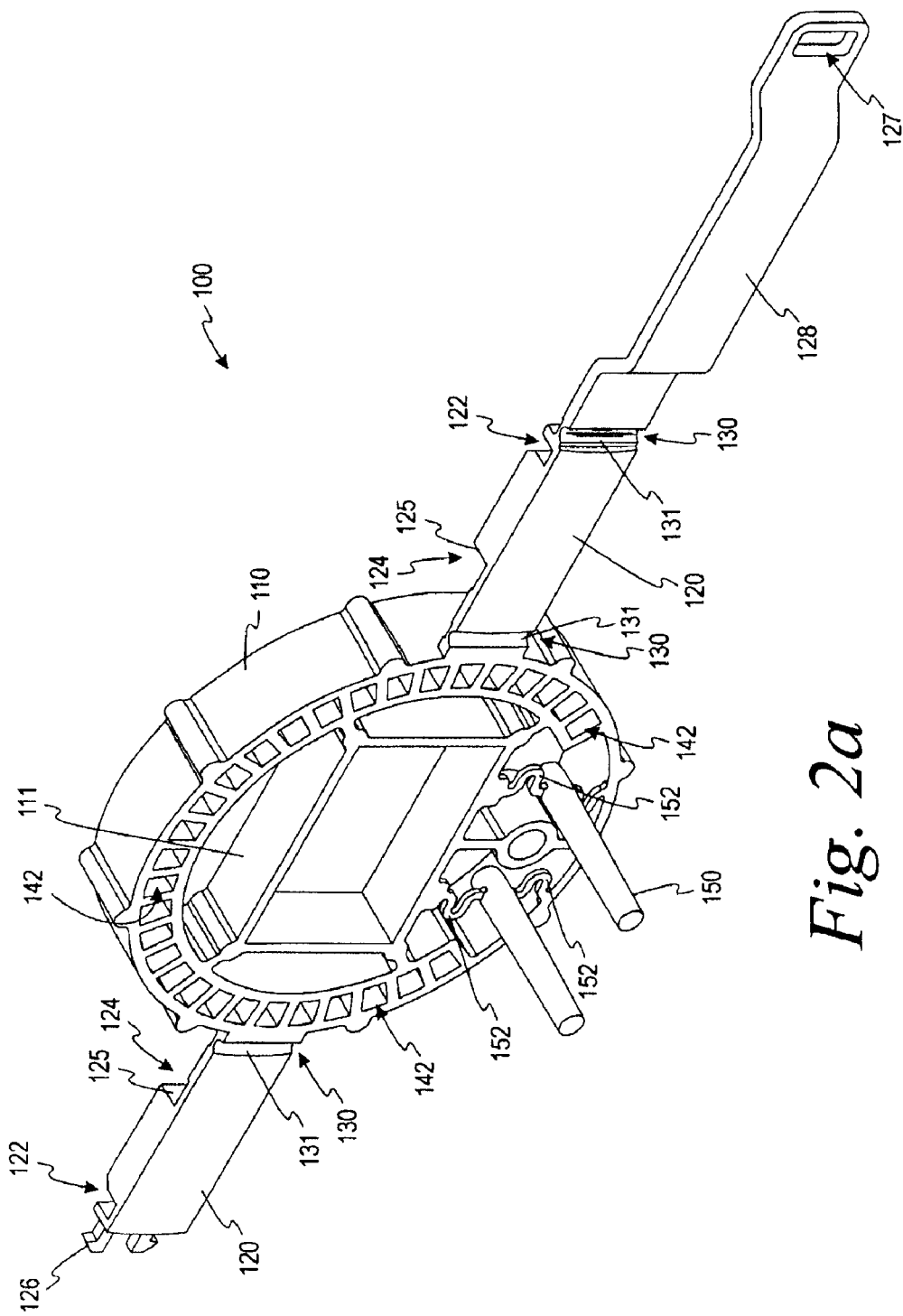
FIGS. 2(a)-(e) are views of a spacer unit in accord with at least some aspects of the present concepts comprising, respectively, an isometric view of the spacer unit, a front view of the spacer unit, a side view of the spacer unit in an open position, a side view of the spacer unit in a closed position, and an isometric view of the spacer unit in a closed position.

FIG. 2(a) shows an isometric view of one embodiment of a spacer unit 100 in accord with at least some aspects of the present concepts. Additional views of this particular spacer unit 100 are shown in FIGS. 2(b)-4. Another embodiment of a spacer unit 200 in accord with at least some aspects of the present concepts is shown in FIG. 5.

Figure 1B:
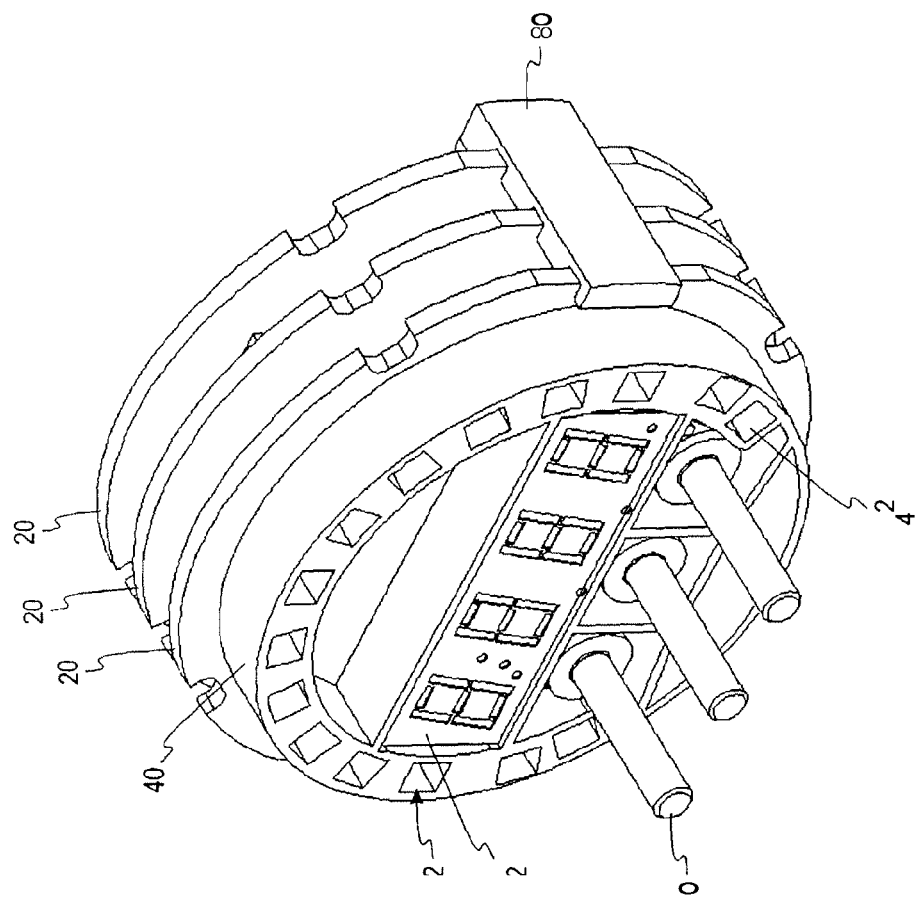

Contrary to the arrangement of spacers 30 for printed circuit boards incorporated into a meter, shown in FIGS. 1(a)-(b), various aspects of the present concepts include a spacer unit 100, such as is shown by way of example in FIGS. 2(a)-5. In accord with the present concepts, separate parts required in the conventional meter are integrated, to varying degrees, to reduce part stock keeping unit identifiers (SKU's) for each of the separate parts, improve production efficiency, and reduce assembly time. The spacer unit 100 embodiment shown in FIGS. 2(a)-(e) and FIGS. 3-4 is adapted, by way of example, to an Auto Meter Wide Band Air/Fuel Ratio Gauge, manufactured by Auto Meter Products, Inc., of Sycamore, Ill. As used hereinafter, the term meter will be generally used, for brevity, to refer to any manner of gauge, meter, instrument, or electronic device, without limitation, and is not to be construed as being limited in any way to a meter.

As shown in FIGS. 2(a)-4, the spacer unit 100 comprises a dial spacer 110. In the illustrated example, the outside diameter of the dial spacer 110 is about 0.913 inches (about 23.19 mm) and the thickness of the dial spacer is about 0.283 inches (about 7.19 mm). However, these dimensions, as well as all other dimensions disclosed herein, represent examples, are merely for reference, and are not limiting to the general concepts disclosed herein. The structure and dimensions of the dial spacer, as well as the other components discussed below in association with FIGS. 2(a)-5, may be freely varied to suit a particular meter.

Figure 2B:
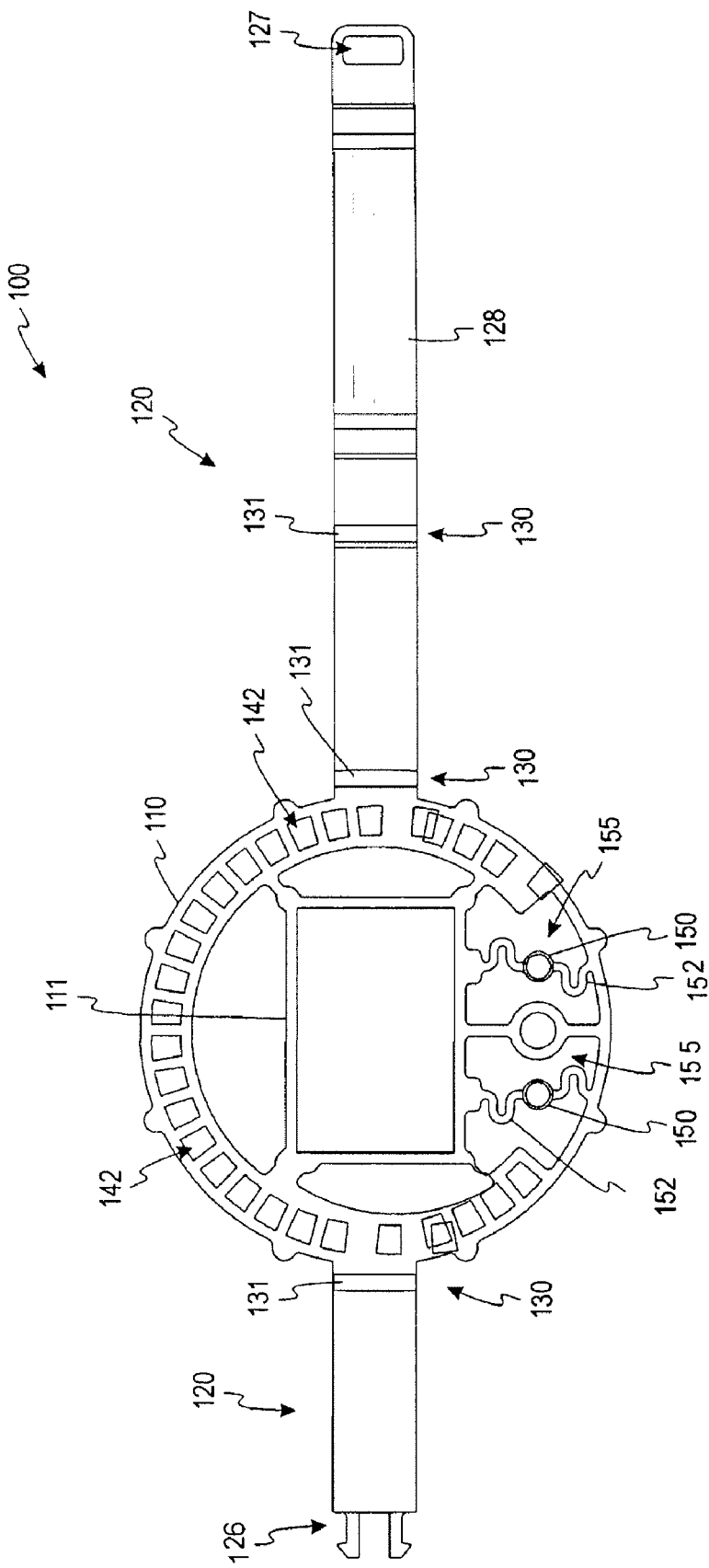
Figure 2C:
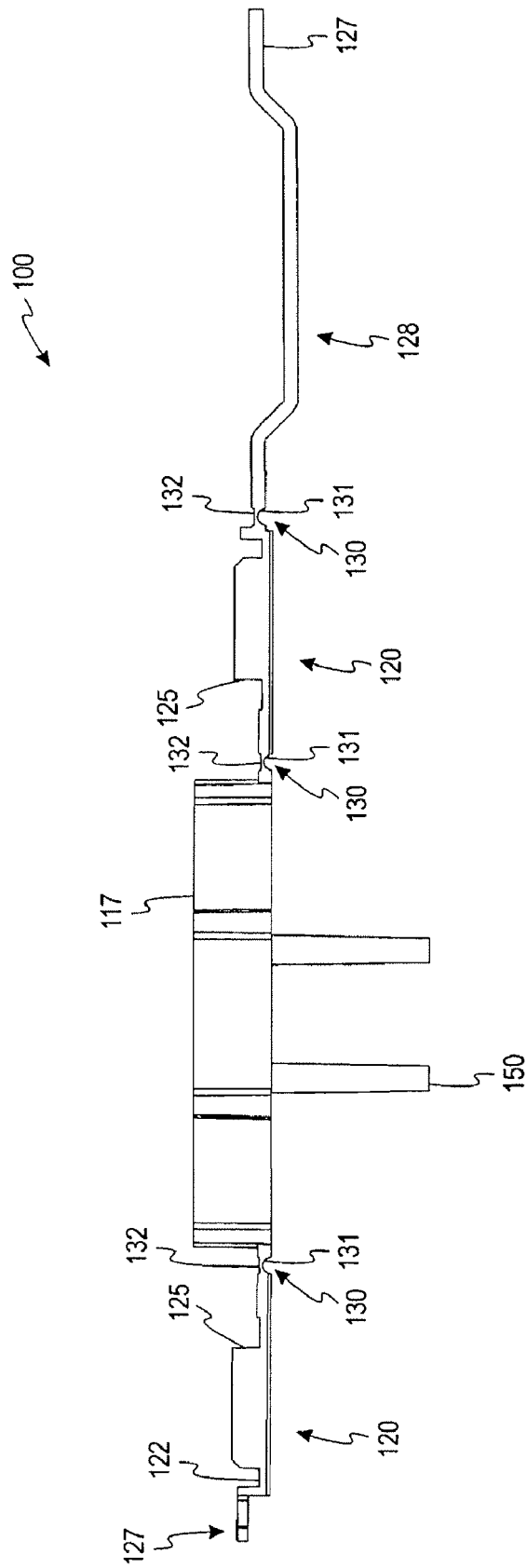
Figure 2D:
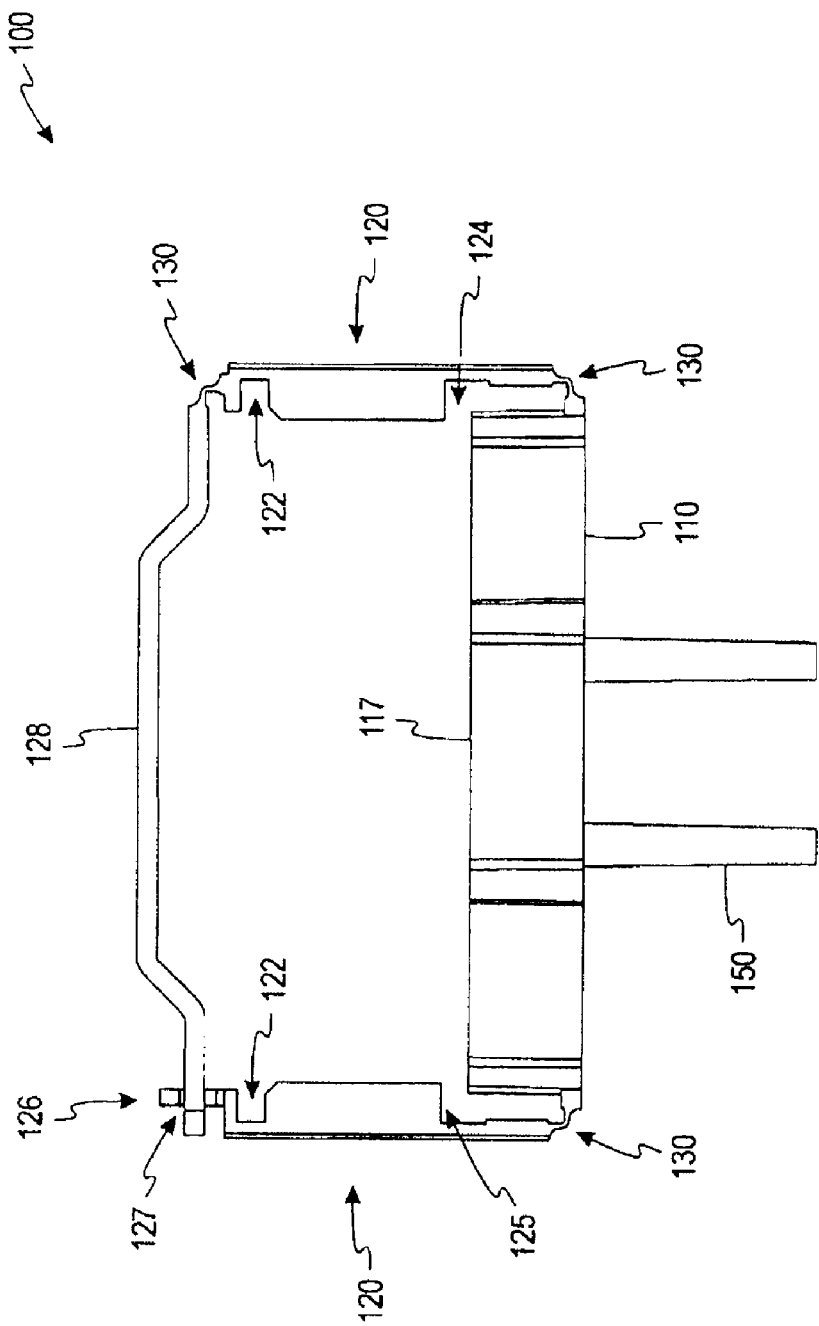

In the spacer unit 100 of FIGS. 2(a)-4, the dial spacer 110 has lateral spacers 120 formed at opposing sides thereof, the lateral spacers being configured to space apart a predetermined number of printed circuit boards (PCBs)(not shown) when the lateral spacers are rotated to substantially assume the position shown in FIG. 2(d). In the embodiment shown in FIGS. 2(a)-4, the lateral spacers 120 are configured to space apart two PCBs, but a greater or lesser number of lateral spacers 120 may be provided. A first pair of grooves 122 is provided to secure a bottom PCB. A second pair of grooves 124 form a shelf 125 upon which a second PCB may be held between the shelf 125 and a rear surface 117 of the dial spacer 110, such relation between the rear surface of the dial spacer 110 and the shelf being shown in FIG. 2(d). Any number of grooves and/or connecting members may be provided to accommodate a desired number of PCBs (e.g., one, two, three, four, etc.), thickness of PCB (e.g., about 0.075 inches or 1.90 mm), or landing or component (e.g., a connecting member) of a PCB. In the assembled meter, a dial face or window (not shown) is disposed atop the dial spacer 110. The dial face or window is, likewise, retained in place between a bezel or collar circumscribing the outer periphery of the dial face or window and a housing and/or the front face of the dial spacer. A graphic insert may also be advantageously provided between the dial spacer 110 and the dial face or window to provide reference information for the meter and/or to obscure underlying portions of the meter.

As shown in FIGS. 2(a)-4, a first spacer 120 is flexibly affixed by a joint 130 to a proximal end of an optional rear connecting member 128, which is provided with an optional connecting member 127 (e.g., a female connecting member comprising a recess or through-hole) at a distal end thereof. Likewise, at an end of the second spacer 120 is an optional connecting member 126 (e.g., a male snap-fit prong or prongs) configured to matingly connect to the connecting member 127. When the lateral spacer 120 and rear connecting member 128 are disposed in the configuration shown in FIG. 2(d), the connecting members 126, 127 are disposed adjacent each other and may be readily connected to securely hold in place the meter assembly comprising the PCBs. In lieu of connecting members 126, 127, the rear connecting member 128 could be connected to the lateral spacer 120 in another manner such as, but not limited to, clasps, ties, ultrasonic welding, adhesive bonding, thermal bonding, or the like.

In another aspect of the depicted embodiment of FIGS. 2(a)-4, in lieu of the connecting member 127 (e.g., a female connecting member, as shown) being provided at a distal end of the rear connecting member 128, a flexible joint 130 may be substituted therefore and a second lateral spacer flexibly affixed to the rear connecting member thereby. In essence, the lateral spacer 120 depicted on the left side of FIGS. 2(a)-(b) is, in such aspect(s), which is not illustrated in the attached figures, attached directly to rear connecting member 128 rather than the dial spacer 110. In this configuration, connecting members could be provided on the second lateral spacer 120 and on the dial spacer 110 to facilitate mating connection of the second lateral spacer and dial spacer or, alternatively, the second lateral spacer 120 could be connected to the dial spacer 110 in another manner such as, but not limited to, clasps, ties, ultrasonic welding, adhesive bonding, thermal bonding, or the like.

In yet another aspect, although not shown in the figures, the rear connecting member 128 shown in FIGS. 2(a)-3 may be segmented and distributed, in any proportion, between the lateral spacers 120. For example, the rear connecting member 128 may be divided in half and distributed in equal proportion to ends of the lateral spacers 120. In at least some aspects, each of the rear connecting member portions are connected to a respective one of the lateral spacers 120 by a flexible joint. In such configuration, the connecting members 126, 127, if provided, could be disposed at the free ends of the rear connecting members and the connection effected at the junction of the rear connecting members rather than at the junction between the rear connecting member 128 and the lateral spacer 120.

FIG. 2(d) shows the spacer unit 100 in an assembled position wherein the lateral spacers 120 are disposed to extend downwardly or rearwardly from the dial spacer 110. In the assembled state, shown in FIG. 4, the spacer unit 300 lateral spacers 120 engage and hold the PCBs 210 and 220 via the groove pairs 124, 122, respectively. As shown in FIG. 2(d), the rear connecting member 128, when folded or rotated to the position shown, extends across a back side of the bottommost PCB to connect to the opposing lateral spacer 120 via an engagement of connecting member 127 and connecting member 126. As noted above, the rear connecting member 128 may be joined to the lateral spacer 120 using any manner of releasable connection (e.g., clasp, tie, male/female members, etc.) or any manner of permanent connection (e.g., ultrasonic welding, adhesives, etc.).

In still another aspect, the rear connecting member 128 may be entirely omitted. For example, in at least one embodiment in accord with the present concepts, the grooves 122, 124 and/or the rear side of the dial spacer 110 may be advantageously provided with connecting members that inhibit and/or prevent movement of the lateral spacers 120 and/or dial spacer relative to the PCBs 210, 220 borne thereby. For example, the grooves 122 could comprise a snap-fit connecting member configured to engage a corresponding snap-fit connecting member affixed to PCB 220, thus obviating the need for the rear connecting member 128. Alternatively, the grooves 122 may simply be dimensioned to provide a strong interference fit between the lateral spacers 120 and the PCB 220 so that the PCBs are tightly engaged by the lateral spacers. Thus, although the depicted embodiment comprising the rear connecting member 128 is provided in accord with at least some aspects of the present concepts, the rear connecting member is not required and may be advantageously omitted.

FIGS. 2(a)-(b) and FIGS. 2(e)-4 further show that dial spacer 110 defines a plurality of openings 142 disposed about a predetermined circumference of a peripheral portion of the dial spacer. These openings 142 correspond to the locations of LEDs 212 disposed about a circumferential portion of the uppermost PCB, such as is shown by way of example in FIG. 3. In FIG. 3, the openings 142 correspond in number (e.g., 30, as shown) and location to the LEDs 212 disposed on PCB 210 and permit transmission of light therethrough.

Figure 2E:
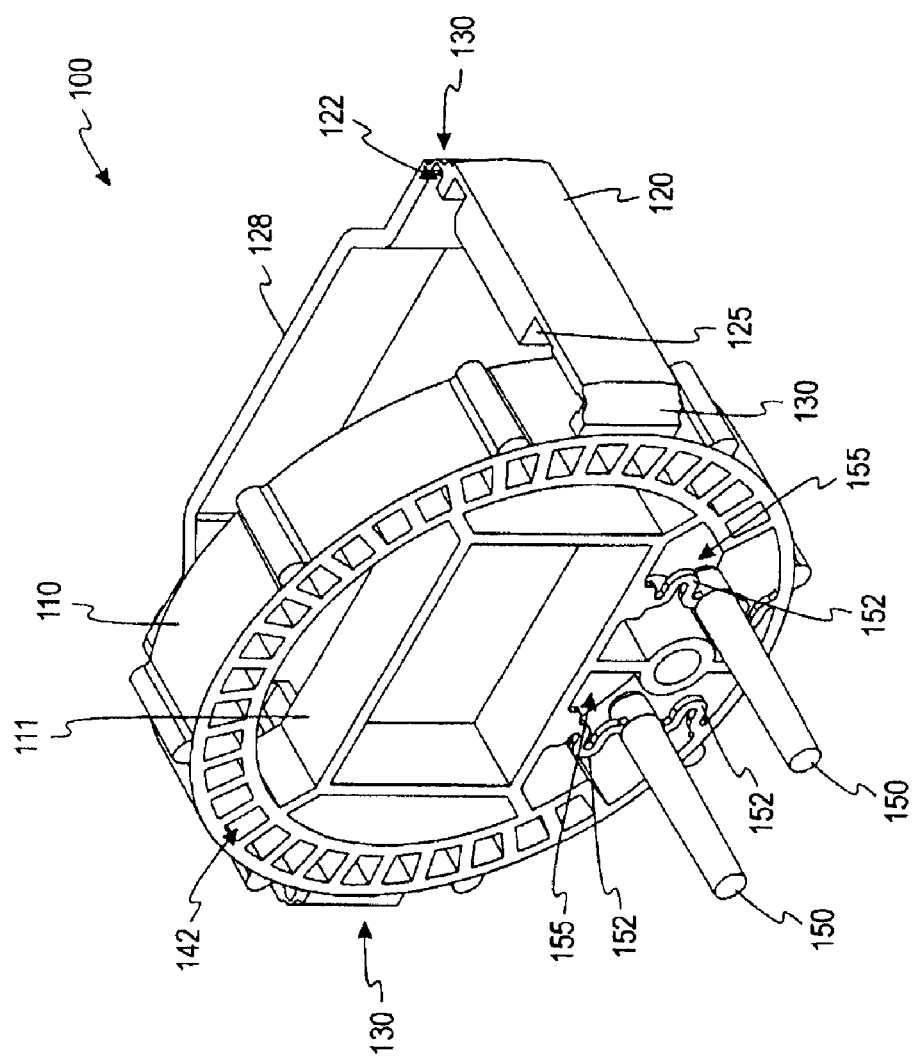

The pushbutton shafts 150 are shown in FIGS. 2(a)-(b) and FIGS. 2(e)-4 to be positioned over openings 155 (see, e.g., FIGS. 2(b) and 2(e)) defined within the dial spacer 110 in a location corresponding to the locations of the shaft switching elements 214 on the uppermost PCB 210 (see FIG. 3). As shown in FIGS. 2(a)-(b), for example, the pushbutton shafts 150 are resiliently suspended over the openings by resilient links (e.g., springs) 152. In the illustrated embodiment, the radius of the outer portions of each resilient link 152, which bends approximately 90° to assume the position shown in FIG. 2(d), is about 0.015 inches (about 0.38 mm) and the radius of the inner or central portion of each link, which bends approximately 180°, is about 0.045 inches (about 1.14 mm). In the embodiment shown by way of example in FIGS. 2(a)-4, the distance between the center of the pushbutton shafts 150 and the center of curvature for the inner or central portion of each link 152 is about 0.130 inches (about 3.30 mm) along a vertical axis and about 0.060 inches (about 1.52 mm) along a laterally disposed axis. The pushbutton shafts 150 are, in the illustrated example, about 0.667 inches (about 16.94 mm) long, with about 0.572 inches (about 14.53 mm) of that length extending above a plane of the face of the dial spacer 110 and about 0.095 inches (about 2.41 mm) of that length extending below such plane. As illustrated, the pushbutton shafts 150 are about 0.108 inches (about 2.74 mm) in diameter. As noted above, these dimensions are merely illustrative of one example of a spacer unit 100 in accord with the present concepts and are not to be construed as being limiting as to the general concepts presented herein.

The resilient links 152 flex to permit a force applied to a portion of the pushbutton shaft 150 accessible through a dial face or window of the meter or gauge to translate into a corresponding inward movement of the shaft into the meter (or other device). The inward movement of each pushbutton shaft 150, in turn, actuates a corresponding one of the shaft switching elements 214 to cause a change in a state thereof (e.g., on/off, reset, mode change, enter, exit, etc.).

As shown in the example of FIGS. 2(a)-4, the resilient links 152 are curvilinear along the plane of the face of the dial spacer 110. There is no requirement that such resilient links 152 be curvilinear. Further, there is no requirement that the resilient links 152 be attached at more than one point. For example, the resilient links 152, of whatever shape, may be cantilevered. Thus, although not shown in the drawings, the resilient links 152 may assume any other desired form including, but not limited to, a planar link, a straight link, parallel links, singular links, plural links, and/or any combination thereof. In one example, the resilient links may be curvilinear and comprise a spiral shape (e.g., an Archimedean spiral, a spherical spiral, a concho-spiral, etc.) joined to the dial spacer 110 at one or more points. For example, a spiral may be joined at one or more sidewalls of the opening 155 with a pushbutton shaft 150 disposed at a center landing of the spiral. Further, although not shown, the resilient link may be cantilevered, as noted above. In such aspect, in view of the slight rotational movement of the pushbutton shaft 150, the center of action of the pushbutton shaft 150 may be optionally displaced slightly from the center of the shaft switching elements 214 so as to account for the angular component of displacement as the shaft moves toward the associated one of the shaft switching elements 214. Additionally, the bottom portion of the pushbutton shafts 150 may likewise be provided with a profile (e.g., a slightly angled surface) and/or length to provide repeatable and reliable contact with the shaft switching elements 214. Still further, the switching element 214 for such configuration may be slightly offset (e.g., not coaxial) from a center equilibrium position of the pushbutton shaft 150.

Still further, the resilient links 152 may optionally be curvilinear along a different axis than shown (e.g., only toward a rear surface of the dial spacer 110) or along more than one axis. For example, although not shown in the figures, the resilient links 152 could be configured to curve inwardly toward a rear surface of the dial spacer 110, as well as along the plane of the face of the dial spacer. Accordingly, that pushbutton shafts 150 may be integrally formed as part of the dial spacer 110 to, as noted above, reduce part SKU's, improve production efficiency, and reduce assembly time.

The dial spacer 110 illustrated in FIGS. 2(*a*)-4 further defines a display element opening 111 dimensioned to receive a display element (see, e.g., reference numeral 275 in FIG. 5) attached to an upper PCB. In the depicted configuration, the display element opening 111 is defined by sidewalls formed to be approximately 0.883 inches (about 22.43 mm) wide and about 0.568 inches (about 14.43 mm) high. As noted above, these dimensions, as well as the other disclosed dimensions, are merely illustrative of examples consistent with the present concepts and are not to be construed as limiting the disclosed concepts in any way. The display element 275 may comprise a LED display, or other display type, and is, in at least some aspects, configured to display information in a numeric or alphanumeric format to provide information corresponding in type to the meter. For example, for an Auto Meter DPIC gauge, the display element 275 provides information such as, but not limited to, a horsepower (e.g., a peak horsepower), a ¼ mile speed, a reaction time, an acceleration time (e.g., 0 to 60 mph), a braking distance (e.g., 60 to 0 mph), and real-time G Forces (e.g., front-back or lateral).

The spacer unit 100 dial spacer 110 further defines a plurality of openings 142 corresponding to the locations of the plurality of LEDs 212 disposed about a circumferential portion of the uppermost PCB 210, shown in FIG. 3, to permit transmission of light therethrough. In the aspect illustrated in FIGS. 2(*a*)-4, each of the openings 142 is defined by an arc length of about 9.2°, an inner radius of about 0.703 inches (about 17.87 mm) and an outer radius of about 0.808 inches (about 20.52 mm). As noted above, for this particular configuration of gauge, the outside diameter of the dial spacer 110 is about 0.913 inches (about 23.19 mm). The inside diameter of the portion of the dial spacer in which the openings 142 are formed is about 0.663 inches (about 16.84 mm), thus forming a ring having a thickness of about 0.25 inches (about 6.35 mm) that spans a circumferential arc of about 279°. However, as also noted above, the structure and dimensions of the dial spacer and associated components defined thereby may be freely varied in accord with the requirements of the particular meter.

As noted above, FIGS. 2(*a*)-4 correspond particularly to a spacer unit 100 for an Auto Meter Wide Band Air/Fuel Ratio Gauge. To reiterate what has been stated previously, this is merely one example of an application of the present concepts and in no way is limiting of the concepts presented herein. In one embodiment of such a meter, the leftmost grouping of LEDs 212 (e.g., the leftmost and bottommost eight LEDS) shown in FIG. 3 correspond to, for example, varying degrees of leanness of the exhaust mixture and the rightmost grouping of LEDs (e.g., the rightmost and bottommost eight LEDS) shown in FIG. 3 correspond to, for example, varying degrees of richness of the exhaust mixture. The center and topmost grouping of LEDs 212 (e.g., the center fourteen LEDS) shown in FIG. 3 correspond to, for example, varying degrees of a Stoichiometric exhaust mixture that is neither rich nor lean. The LEDs 212 are, in at least some aspects, provided with different colors to indicate the different characteristics or categories of a measured quantity. For example, the LEDs 212 corresponding to the lean air/fuel ratios may be red, the LEDs corresponding to the rich air/fuel ratios may be yellow, and the LEDs corresponding to the Stoichiometric air/fuel ratios may be green. In one embodiment, the air/fuel ratio is represented as being perfectly Stoichiometric when no LEDs 212 are energized since the centermost LEDs are displaced slightly to the left and right of a top dead center position of the gauge. As the air/fuel ratio moves from this perfect Stoichiometric ratio, the LEDs to the left or right of the top dead center point will be sequentially energized in correspondence to the leanness or richness, respectively, of the measured oxygen in the exhaust. FIG. 3 also generally shows representations of various electrical connecting members 222, 226 (e.g., sensor terminal(s), power supply(ies)/battery(ies), board connecting members, etc.) and electrical components 224 (e.g., controller, processor, etc.), which are not specifically relevant to the concepts described herein and, accordingly, a detailed description thereof is omitted.

The flexible joints 130 of the spacer unit 110 comprise, in one aspect, a substantially semi-circular groove 131 having a radius of about 0.030 inches (about 0.76 mm). An opposing side of the flexible joints 130 may optionally comprise a groove 132, such as is shown in FIG. 2(*c*), to enhance the pliability of the flexible joints. The groove 132 is, in one aspect, about 0.008 inches (about 0.20 mm) deep and about 0.060 inches (about 1.52 mm) wide and is centered with respect to a center of the radius of curvature of the substantially semi-circular groove 131. In this particular configuration, the thickness of the joint between the groove 132 and the substantially semi-circular groove 131 is about 0.012 inches (about 0.30 mm). In accord with the present concepts, the grooves 131, 132 may assume any shape and need not present a substantially circular or a substantially planar profile. For example, the flexible joint could comprise two opposing triangular notches, a triangular notch in opposition to a substantially planar groove, opposing curvilinear grooves, a singular triangular notch, or any manner of stress riser. Moreover, although the flexible joints 130 are shown to be continuous, the flexible joints may alternatively be discontinuous. For example, the joints 130 may comprise through-holes or openings therein.

Figure 4:
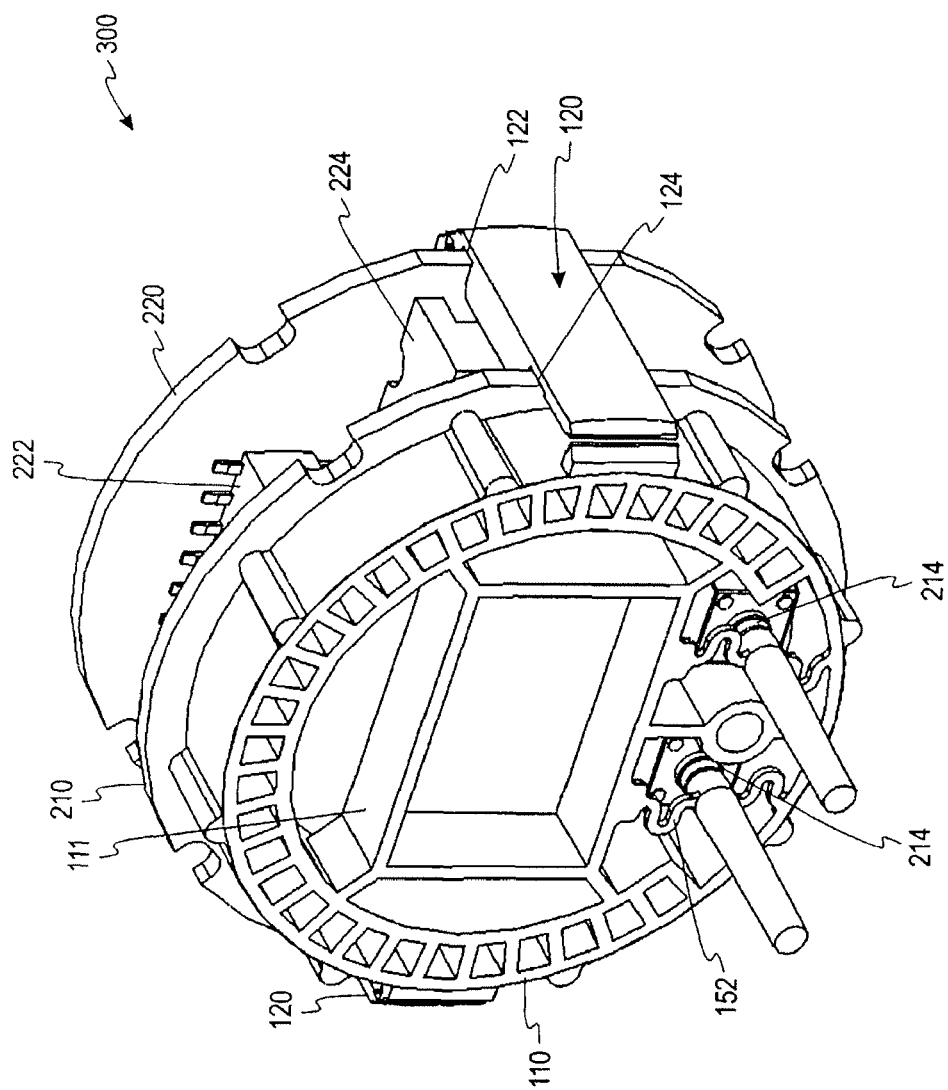
FIG. 4 is an isometric view of a spacer unit in accord with at least some aspects of the present concepts disposed over and around two printed circuit boards.
Figure 5:
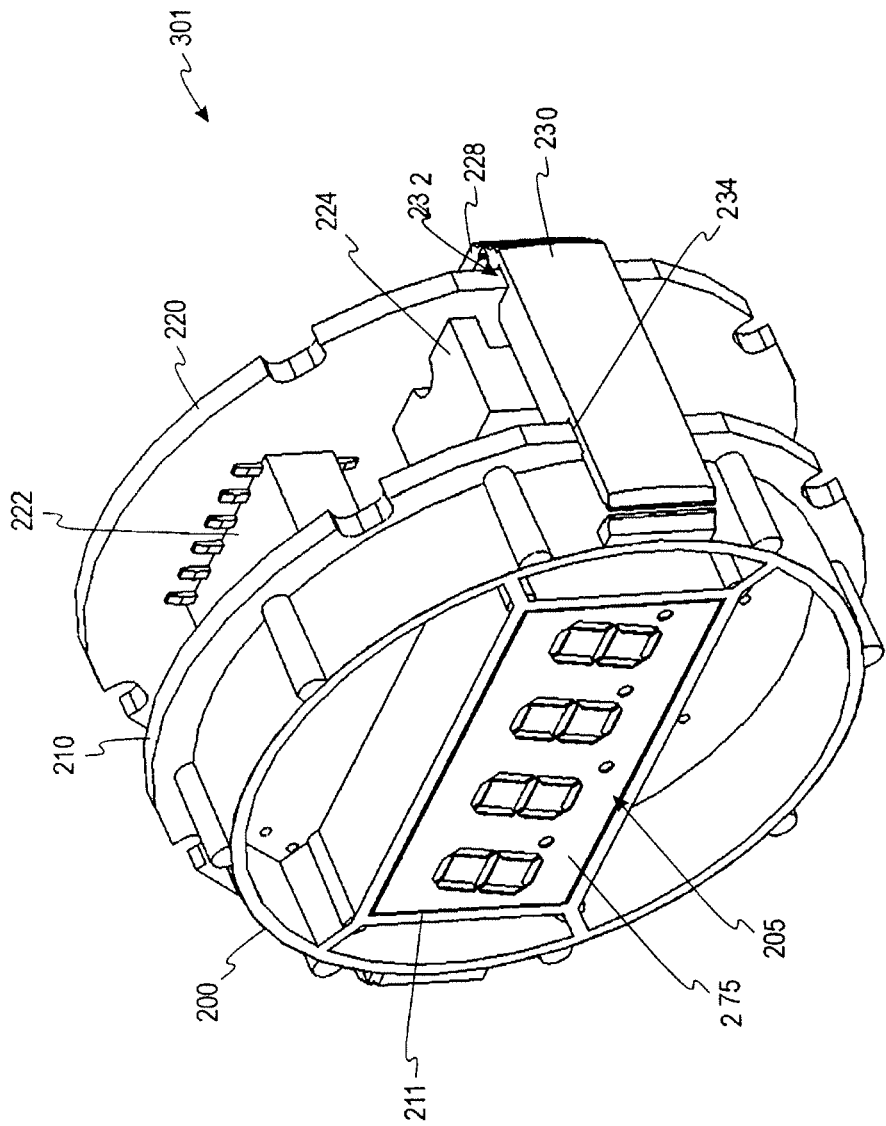
FIG. 5 is an isometric view of another spacer unit in accord with at least some aspects of the present concepts disposed over and around two printed circuit boards.

FIG. 4 shows a meter subassembly 300 comprising the spacer unit 100 of FIGS. 2(*a*)-3. The meter subassembly 300 is assembled by moving the lateral spacers 120 downwardly or rearwardly from the dial spacer 110 to engage and hold the PCBs 210 and 220. The grooves 122 engage and hold PCB 220, whereas the grooves 124 engage and hold PCB 210 between a rear surface 117 of the dial spacer 110 and shelf 125. The rear connecting member 128 (not shown) spans a back of the PCB 220 and connects to the other lateral spacer 120 via an engagement of the associated connecting members 126, 127. As noted above, the rear connecting member 128 may be joined to the lateral spacer 120 using any conventional releasable connection member (e.g., clasp, tie, male/female members, etc.) or permanent connection means (e.g., ultrasonic welding, adhesives, etc.).

FIG. 5 shows another meter subassembly 301 comprising a spacer unit 200 in accord with at least some aspects of the present concepts. In this meter subassembly 301, the spacer unit 200 lateral spacers 230 and rear connecting member 228 are similar to that shown in FIGS. 2(a)-4. However, in FIG. 5, a different configuration of dial spacer 200 is shown. In the depicted aspect, the dial spacer 210 omits various elements seen in FIGS. 2(a)-4, such as the LED openings and the shaft openings. Instead, the dial spacer 200 of FIG. 5 includes only a display element opening 205 defined by dial spacer sidewalls 211. A display device 275 is shown disposed within the display element opening 205.

The spacer units 100, 200 discussed above may be formed from any metal, composite material, or plastic, and/or combinations thereof, using a manufacturing method appropriate to the selected material(s). For example, the spacer units 100, 200 may be formed as a single unit by injecting a thermoplastic or thermosetting resin into a mold. Suitable plastics for the spacer unit may comprise, but are not limited to, polypropylene, acrylonitrile-butadiene-styrene (ABS), polycarbonate, polyamide, polyethylene, polystyrene, or polyvinyl chloride (PVC).

In accord with the above, it can be seen that a method of making a meter subassembly in accord with at least some aspects of the present concepts includes the act of providing a unitary meter spacer device (e.g., 100; FIGS. 2(a)-4) defining a dial spacer (e.g., 110), a first lateral spacer (e.g., 120) flexibly connected by a joint (e.g., 130) to the dial spacer, a second lateral spacer (e.g., 120) flexibly connected by a joint (e.g., 130) to a portion of the dial spacer opposite to the first lateral spacer, and a rear connecting member (e.g., 128) flexibly connected by a joint at a first end to the second lateral spacer, the first lateral spacer and the second lateral spacer each comprising a connection member (e.g., 126, 127) adapted to connect to a circuit board. The method further includes the act of rotating the first and second lateral spacers about the joint connecting the respective first and second lateral spacers to the dial spacer to extend outwardly and substantially downwardly relative to the dial spacer (see, e.g., FIG. 2(d)). The method still further includes the acts of providing a first circuit board, connecting the first circuit board to the connection member of the first lateral spacer, connecting the first circuit board to the connection member of the second lateral spacer, and connecting a second end of the rear connecting member to the first lateral spacer, such as is represented by the completed assembly in FIG. 3, for example. In at least some aspects, the act of connecting the second end of the rear connecting member to the first lateral spacer includes connecting a male and female connecting members of the rear connecting member and the first lateral spacer. In other aspects, this act may comprise adhesively connecting or thermally coupling (e.g., for a thermoplastic or a metal material) the rear connecting member to the first lateral spacer.

The method described in the preceding paragraph may additionally include the act of providing each of the first and second lateral spacers with at least a first and second grooves, each of the first and second grooves being adapted to receive a circuit board. Additionally, the method may correspondingly include the acts of providing a second circuit board, connecting the first circuit board to the first groove in each of the first and second lateral spacers, connecting the second circuit board to the second groove in each of the first and second lateral spacers, and connecting a second end of the rear connecting member to the first lateral spacer. The preceding steps thus form a meter subassembly, in accord with at least some aspects of the present concepts, comprising a unitary meter spacer device and a first and second circuit boards. As previously noted, the methods and structures disclosed herein by way of example may be adapted to retain any number of circuit boards.

Consistent with the description above, the act of defining within the dial spacer at least one pushbutton opening may comprise forming, such as during an injection molding of a resin into a mold, at least one resilient link spanning the at least one pushbutton opening. This act may also include, for example, the act of forming a pushbutton protruding from at least one resilient link.

In still other aspects of at least some embodiments of the present concepts, a method of making a meter is provided comprising the act of forming a meter subassembly. With reference to the example of FIG. 4 for illustration, the meter subassembly 300 is formed by securing a plurality of PCBs 210, 220 to a spacer unit 100, the spacer unit comprising a dial spacer 110 and a plurality of lateral spacers 120 depending therefrom. Each of the lateral spacers 120 comprises a plurality of spaced apart PCB connection members (e.g., grooves 122, 124) to retain a plurality of circuit boards 210, 220 in a spaced apart configuration. The method also includes the acts of providing a meter housing (not shown) defining a cavity, inserting the meter subassembly into the housing, placing a dial face (not shown) over the dial spacer, and connecting the dial face to the housing. Additional acts may include, with reference to the example of FIGS. 2(a)-3, for example, defining within the dial spacer 110 one or more pushbutton opening(s) 155 comprising one or more resilient link(s) 152 spanning the pushbutton opening(s) or rotating the lateral spacers 120 relative to the dial spacer to place the plurality of spaced apart PCB connection members (e.g., grooves 122, 124) on each of the lateral spacers in opposition to one another to form a plurality of groupings of connection members, each grouping of connection members being configured to retain a PCB.

While the presently disclosed concepts have been described with reference to one or more particular embodiments, those skilled in the art will recognize that many changes may be made thereto without departing from the spirit and scope of the presently disclosed concepts. For example, although the examples discussed above refer to printed circuit boards, the present concepts extend not only to circuit boards, in general, but also to any other structures, whether bearing electronic components or not, for which it is desired to facilitate assembly of the separate parts into a subassembly. Further, any combination and sub-combination of the examples, embodiments, aspects, materials, claims, claim elements, or components disclosed herein, however termed, are expressly contemplated as falling within the present concepts.

Embodiment A

As noted above, in one aspect of at least some embodiments in accord with the present concepts, a meter spacer unit includes a dial spacer, a lateral spacer flexibly connected to the dial spacer by a first joint, and a rear connecting member flexibly connected to the lateral spacer by a second joint and the lateral spacer includes a connection member adapted to connect to a printed circuit board.

Alternative Embodiment A1

In a meter spacer according to embodiment A, the lateral spacer may further comprise a second lateral spacer flexibly connected to the dial spacer by a third joint

Alternative Embodiment A2

In a meter spacer according to embodiments A-A1, the dial spacer defines a pushbutton opening and comprises a resilient link spanning the pushbutton opening.

Alternative Embodiment A3

In a meter spacer according to embodiment A2, the resilient link comprises a pushbutton shaft extending therefrom.

Alternative Embodiment A4

In a meter spacer according to embodiment A2, the resilient link may be curvilinear over at least a portion of a length thereof along one axis or more than one axis.

Alternative Embodiment A5

In a meter spacer according to embodiment A, the dial spacer defines more than one pushbutton opening and comprises a resilient link spanning each of the pushbutton openings.

Alternative Embodiment A6

In a meter spacer according to embodiment A1, the meter spacer unit dial spacer defines a display element opening.

Alternative Embodiment A7

In a meter spacer according to embodiment A1 or A6, the meter spacer unit dial spacer defines a plurality of openings substantially evenly spaced apart about a peripheral portion thereof.

Alternative Embodiment B

A meter dial spacer unit comprises an injected molded body, the body defining a pushbutton opening and one or more resilient links spanning the pushbutton opening, the or more resilient links having a pushbutton shaft extending therefrom.

Alternative Embodiment B1

In a meter dial spacer unit according to alternative embodiment B, the one or more resilient links are curvilinear over at least a portion of a length thereof

Alternative Embodiment B2

In a meter dial spacer unit according to alternative embodiments B-B1, the body defines a plurality of pushbutton openings and one or more resilient links spanning each of the pushbutton openings,

Alternative Embodiment B3

In a meter dial spacer unit according to alternative embodiments B-B2, each of the resilient links comprises a pushbutton shaft extending therefrom.

Alternative Embodiment B4

In a meter dial spacer unit according to alternative embodiment B3, the body defines at least one display element opening

Alternative Embodiment B5

In a meter dial spacer unit according to alternative embodiment B4, the body defines a plurality of openings substantially evenly spaced apart about a peripheral portion thereof.

Alternative Embodiment B6

In a meter dial spacer unit according to alternative embodiment B, the meter dial spacer unit further comprises one or more lateral spacer(s) integrally formed with the body, the lateral spacer(s) being connected to the body by a flexible joint.

Alternative Embodiment C

A meter comprises a unitary meter spacer device defining a dial spacer, at least one lateral spacer flexibly connected to the dial spacer by a first joint and positioned to extend outwardly beneath the dial spacer, and a rear connecting member flexibly connected by a second joint to the at least one lateral spacer, the at least one lateral spacer comprising a connection member adapted to connect to a circuit board and the dial spacer comprising a display device opening; a first circuit board comprising a display device, the first circuit board being disposed behind the dial spacer and being connected to the lateral spacer connection member with the display device being positioned to at least substantially occupy the dial spacer display device opening; a housing defining a cavity; and a dial face connected to the housing, wherein the unitary meter spacer device and the attached first circuit board are disposed within the housing cavity with the display device disposed adjacent the dial face.

Alternative Embodiment C1

In a meter according to alternative embodiment C, the at least one lateral spacer flexibly connected to the dial spacer by a first joint comprises a first lateral spacer comprising said first joint, and a second lateral spacer comprising a second joint connecting the second lateral spacer to the dial spacer, a first end of the rear connecting member is flexibly connected to the first lateral spacer by a third joint, and a second end of the rear connecting member is attached to the second lateral spacer.

Alternative Embodiment C2

In a meter according to alternative embodiment C1, the lateral spacer connection member comprises a groove dimensioned to receive a peripheral portion of the first circuit board.

Alternative Embodiment C3

In a meter according to alternative embodiment C1, the lateral spacer connection member comprises a first snap-fit connecting member, and the first circuit board comprises a second snap-fit connecting member configured to matingly engage the first snap-fit connecting member.

Alternative Embodiment C4

In a meter according to alternative embodiment C1, each of the first lateral spacer and the second lateral spacer comprises at least a respective first groove and a second groove.

Alternative Embodiment C5

In a meter according to alternative embodiment C4, the meter further comprises a second circuit board, the second

Alternative Embodiment C6

In a meter according to alternative embodiment C5, the second lateral spacer comprises, at a distal end portion thereof, a male connecting member or a female connecting member.

Alternative Embodiment C7

In a meter according to alternative embodiment C6, the rear connecting member comprises, at a distal end portion thereof, another one of a male connecting member or a female connecting member dimensioned to connect with the corresponding male connecting member or female connecting member of the second lateral spacer.

Alternative Embodiment C8

In a meter according to alternative embodiment C1, the dial spacer further defines a pushbutton opening and comprises a resilient link spanning the pushbutton opening.

Alternative Embodiment C9

In a meter according to alternative embodiment C8, the resilient link comprises a pushbutton shaft extending therefrom.

Alternative Embodiment C10

In a meter according to alternative embodiments C8-C9, the resilient link is curvilinear over at least a portion of a length thereof.

Alternative Embodiment C11

In a meter according to alternative embodiment C1, the dial spacer further defines a plurality of pushbutton openings and comprises a resilient link spanning each of the pushbutton openings.

Alternative Embodiment C12

In a meter according to alternative embodiment C11, each of the resilient links comprises a pushbutton shaft extending therefrom.

Alternative Embodiment C13

In a meter according to alternative embodiment C1, the first circuit board comprises a plurality of light emitting devices, and the dial spacer comprises a plurality of openings formed in locations corresponding to the light emitting devices and disposed over the light emitting devices.

Alternative Embodiment C14

In a meter according to alternative embodiment C1, the first circuit board comprises a plurality of light emitting devices substantially evenly spaced apart about a peripheral portion thereof, and the dial spacer comprises a plurality of openings formed substantially evenly spaced apart about a peripheral portion thereof in locations corresponding to the light emitting devices and disposed over the light emitting devices.

circuit board being disposed within the second groove of the first lateral spacer and the second lateral spacer.

Alternative Embodiment D

A method of making a meter subassembly comprises the acts of providing a unitary meter spacer device defining a dial spacer, a first lateral spacer flexibly connected by a first joint to the dial spacer, a second lateral spacer flexibly connected by a third joint to a portion of the dial spacer opposite to the first lateral spacer, the first lateral spacer and the second lateral spacer each comprising a first connection member adapted to connect to a circuit board, rotating the first lateral spacer about the first joint connecting the first lateral spacer to the dial spacer to extend outwardly and substantially downwardly relative to the dial spacer, rotating the second lateral spacer about the third joint connecting the second lateral spacer to the dial spacer to extend outwardly and substantially downwardly relative to the dial spacer, providing a first circuit board, connecting the first circuit board to the first connection member of the first lateral spacer, and connecting the first circuit board to the first connection member of the second lateral spacer.

Alternative Embodiment D1

A method of making a meter subassembly according to alternative embodiment D, further comprising the acts of providing the unitary meter spacer device with a rear connecting member flexibly connected by a second joint at a first end to the first lateral spacer, and connecting a second end of the rear connecting member to the second lateral spacer.

Alternative Embodiment D2

A method of making a meter subassembly according to alternative embodiments D-D1, wherein the second end of the rear connecting member comprises a male connecting member or a female connecting member, wherein the first lateral spacer comprises another one of a male connecting member or a female connecting member, and wherein the act of connecting the second end of the rear connecting member to the second lateral spacer comprises connecting the male and female connecting members of the rear connecting member and the second lateral spacer.

Alternative Embodiment D3

A method of making a meter subassembly according to alternative embodiments D-D2, wherein the act of connecting the second end of the rear connecting member to the second lateral spacer comprises thermally coupling or adhesively coupling the rear connecting member to the second lateral spacer.

Alternative Embodiment D4

A method of making a meter subassembly according to alternative embodiments D-D3, wherein the first connection member of the first lateral spacer and the second lateral spacer comprises a groove dimensioned to receive a peripheral portion of the first circuit board.

Alternative Embodiment D5

A method of making a meter subassembly according to alternative embodiments D-D4, wherein the first connection member of at least one of the first lateral spacer and the second lateral spacer comprises a first snap-fit connecting member, and wherein the first circuit board comprises a first snap-fit connecting member configured to matingly engage the first snap-fit connecting member.

Alternative Embodiment D6

A method of making a meter subassembly according to alternative embodiments D-D5, further comprising the acts of providing each of the unitary meter spacer device first lateral spacer and second lateral spacer with a second connection member adapted to connect to a circuit board, providing a second circuit board, connecting the second circuit board to the second groove in the first lateral spacer, and connecting the second circuit board to the second groove in the second lateral spacer.

Alternative Embodiment D7

A method of making a meter subassembly according to alternative embodiments D-D6, further comprising the act of defining within the dial spacer at least one pushbutton opening comprising at least one resilient link spanning the at least one pushbutton opening.

Alternative Embodiment D8

A method of making a meter subassembly according to alternative embodiment D7, further comprising the act of forming a pushbutton protruding from at least one resilient link.

Alternative Embodiment E

A method of making a meter comprises the acts of forming a meter subassembly by securing a plurality of circuit boards to a unitary meter spacer device, the unitary meter spacer device comprising a dial spacer and a plurality of lateral spacers depending therefrom, each of the lateral spacers comprising a plurality of spaced apart circuit board connection members to retain a plurality of circuit boards in a spaced apart configuration, providing a meter housing defining a cavity, inserting the meter subassembly into the housing, placing a dial face over the dial spacer, and connecting the dial face to the housing.

Alternative Embodiment E1

A method of making a meter according to alternative embodiment E, further comprises the act of defining within the dial spacer at least one pushbutton opening comprising at least one resilient link spanning the at least one pushbutton opening.

Alternative Embodiment E2

A method of making a meter according to alternative embodiment E1, further comprises the act of forming a pushbutton protruding from the at least one resilient link.

Alternative Embodiment E3

A method of making a meter according to alternative embodiment E2, further comprising the act of passing the pushbutton through an opening formed in the dial face.

Alternative Embodiment E4

A method of making a meter according to alternative embodiment E, wherein the act of forming a meter subassembly comprises the acts of rotating the first lateral spacer relative to the dial spacer and rotating the second lateral spacer relative to the dial spacer, wherein the acts of rotating place the plurality of spaced apart circuit board connection members on each of the lateral spacers in opposition to one another to form a plurality of groupings of connection members, each grouping of connection members being configured to retain a circuit board.

Alternative Embodiment E5

A method of making a meter according to alternative embodiment E4, wherein the act of forming a meter subassembly comprises the act of connecting a circuit board to each grouping of connection members.

Alternative Embodiment E6

A method of making a meter according to alternative embodiment E5, wherein the act of forming a meter subassembly comprises the acts of providing, at a distal end of least one of the lateral spacers, a rear connecting member, and connecting the rear connecting member to a distal end of another one of the lateral spacers.

Alternative Embodiment E7

A method of making a meter according to alternative embodiment E5, wherein the distal end of the another one of the lateral spacers comprises an opposing lateral spacer.

Each of these embodiments and obvious variations thereof is contemplated as falling within the spirit and scope of the concepts which are set forth in the following claims.

What is claimed is:

1. A meter spacer unit, comprising:
   a dial spacer defining at least one pushbutton opening and comprising at least one resilient link formed to extend over the at least one pushbutton opening;
   a first lateral spacer flexibly connected to the dial spacer by a first joint; and
   a rear connecting member flexibly connected to the first lateral spacer by a second joint,
   wherein at least the first lateral spacer comprises a connection member adapted to connect to a printed circuit board.

2. A meter spacer unit according to claim 1, wherein the meter spacer unit further comprises a second lateral spacer flexibly connected to the dial spacer by a third joint.

3. A meter spacer unit according to claim 1, wherein the lateral spacer connection member comprises a groove.

4. A meter spacer unit according to claim 1, wherein the lateral spacer connection member comprises a snap-fit connecting member.

5. A meter spacer unit according to claim 2, wherein a lateral spacer connection member of each of the first lateral spacer and the second lateral spacer comprises a groove.

6. A meter spacer unit according to claim 5, wherein the groove of the first lateral spacer and the groove of the second lateral spacer are formed along a widthwise dimension of the lateral spacer.

7. A meter spacer unit according to claim 6, wherein the first joint between the dial spacer and the first lateral spacer and the third joint between the dial spacer and the second lateral spacer are disposed in substantially the same plane.

8. A meter spacer unit according to claim 7, wherein the first joint between the dial spacer and the first lateral spacer and the third joint between the dial spacer and the second lateral spacer are disposed to be substantially equidistant from a periphery of the dial spacer.

9. A meter spacer unit according to claim 8, wherein a distance between the groove of the first lateral spacer and the first joint connecting the first lateral spacer to the dial spacer is substantially equally to a distance between the groove of the second lateral spacer and the third joint connecting the second lateral spacer to the dial spacer.

10. A meter spacer unit according to claim 9, wherein each of the first lateral spacer and the second lateral spacer comprises a plurality of spaced apart grooves.

11. A meter spacer unit according to claim 2, wherein each of the first lateral spacer and the second lateral spacer comprises at least a first groove and a second groove.

12. A meter spacer unit according to claim 11, wherein a distance between the first groove of the first lateral spacer and the first joint connecting the first lateral spacer to the dial spacer is substantially equally to a distance between the first groove of the second lateral spacer and the third joint connecting the second lateral spacer to the dial spacer.

13. A meter spacer unit according to claim 12, wherein a distance between the second groove of the first lateral spacer and the first joint connecting the first lateral spacer to the dial spacer is substantially equally to a distance between the second groove of the second lateral spacer and the third joint connecting the second lateral spacer to the dial spacer.

14. A meter spacer unit according to claim 10, wherein the first lateral spacer comprises, at a distal end portion thereof, a male connecting member or a female connecting member.

15. A meter spacer unit according to claim 14, wherein the rear connecting member comprises, at a distal end portion thereof, another one of a male connecting member or a female connecting member dimensioned to connect with the corresponding male connecting member or female connecting member of the first lateral spacer.

16. A meter spacer unit according to claim 1, further comprising a second lateral spacer flexibly connected to the rear connecting member by a third joint, wherein the lateral spacer and the second lateral spacer each comprise a plurality of spaced apart grooves.

17. A meter spacer unit according to claim 16, wherein a distal end portion of the second lateral spacer comprises a male connecting member or a female connecting member.

18. A meter spacer unit according to claim 17, wherein the dial spacer comprises, at a side of the dial spacer substantially opposite the first joint between the dial spacer and the first lateral spacer, another one of a male connecting member or a female connecting member being dimensioned to connect with the corresponding male connecting member or female connecting member of the second lateral spacer.

19. A meter dial spacer unit, comprising:
an injected molded body, the body defining a pushbutton opening;
one or more resilient links disposed to extend over the pushbutton opening;
a pushbutton shaft extending outwardly from at least one of the one or more resilient links.

20. A meter, comprising:
a unitary meter spacer device defining a dial spacer, at least one lateral spacer flexibly connected to the dial spacer by a first joint and positioned to extend outwardly beneath the dial spacer, and a rear connecting member flexibly connected by a second joint to the at least one lateral spacer, the at least one lateral spacer comprising a connection member adapted to connect to a circuit board and the dial spacer comprising a display device opening;
a first circuit board comprising a display device, the first circuit board being disposed behind the dial spacer and being connected to the lateral spacer connection member with the display device being positioned to at least substantially occupy the dial spacer display device opening;
a housing defining a cavity; and
a dial face connected to the housing,
wherein the unitary meter spacer device and the attached first circuit board are disposed within the housing cavity with the display device disposed adjacent the dial face.

21. A meter according to claim 20,
wherein the at least one lateral spacer flexibly connected to the dial spacer by a first joint comprises a first lateral spacer comprising said first joint, and a second lateral spacer comprising a second joint connecting the second lateral spacer to the dial spacer,
wherein a first end of the rear connecting member is flexibly connected to the first lateral spacer by a third joint, and
wherein a second end of the rear connecting member is attached to the second lateral spacer.

22. A method of making a meter subassembly comprising the acts of:
providing a unitary meter spacer device defining a dial spacer, a first lateral spacer flexibly connected by a first joint to the dial spacer, a second lateral spacer flexibly connected by a third joint to a portion of the dial spacer opposite to the first lateral spacer, the first lateral spacer and the second lateral spacer each comprising a first connection member adapted to connect to a circuit board;
rotating the first lateral spacer about the first joint connecting the first lateral spacer to the dial spacer to extend outwardly and substantially downwardly relative to the dial spacer;
rotating the second lateral spacer about the third joint connecting the second lateral spacer to the dial spacer to extend outwardly and substantially downwardly relative to the dial spacer;
providing a first circuit board;
connecting the first circuit board to the first connection member of the first lateral spacer; and
connecting the first circuit board to the first connection member of the second lateral spacer.

23. A method of making a meter, comprising the acts of:
forming a meter subassembly by securing a plurality of circuit boards to a unitary meter spacer device, the unitary meter spacer device comprising a dial spacer and a plurality of lateral spacers depending therefrom, each of the lateral spacers comprising a plurality of spaced apart circuit board connection members to retain a plurality of circuit boards in a spaced apart configuration,
providing a meter housing defining a cavity;
inserting the meter subassembly into the housing;
placing a dial face over the dial spacer; and
connecting the dial face to the housing.

24. A method of making a meter according to claim 23, further comprising the acts of:
defining within the dial spacer at least one pushbutton opening comprising at least one resilient link extending over the at least one pushbutton opening;
forming a pushbutton protruding from the at least one resilient link; and
passing the pushbutton through an opening formed in the dial face.

* * * * *